(12) United States Patent
Ota et al.

(10) Patent No.: US 7,268,596 B2
(45) Date of Patent: Sep. 11, 2007

(54) SEMICONDUCTOR DEVICE FOR DRIVING A LOAD

(75) Inventors: Kingo Ota, Nukata-gun (JP); Shoichi Okuda, Nukata-gun (JP); Hirofumi Abe, Gamagori (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 11/220,529

(22) Filed: Sep. 8, 2005

(65) Prior Publication Data
US 2006/0087348 A1 Apr. 27, 2006

(30) Foreign Application Priority Data
Oct. 26, 2004 (JP) .............................. 2004-310865

(51) Int. Cl.
*H03B 1/00* (2006.01)
(52) U.S. Cl. ..................................... 327/112
(58) Field of Classification Search ................ 327/108, 327/112; 326/82–87
See application file for complete search history.

(56) References Cited

U.S. PATENT DOCUMENTS

| | | | |
|---|---|---|---|
| 5,502,632 A | * | 3/1996 | Warmerdam et al. .......... 363/98 |
| 5,543,740 A | * | 8/1996 | Wong .......................... 327/108 |
| 6,191,625 B1 | * | 2/2001 | Wachter et al. .............. 327/108 |
| 6,661,208 B2 | * | 12/2003 | Rutter et al. ................. 323/224 |
| 6,674,268 B2 | * | 1/2004 | Rutter et al. ................. 323/224 |

FOREIGN PATENT DOCUMENTS

JP      A-2001-305632      11/2001

OTHER PUBLICATIONS

"TPD2004F—Toshiba Intelligent Power Device Silicon Monolithic Power MOS IC," Toshiba Semiconductor Company, Sep. 11, 1998 (discussed on p. 1 of the specification).

* cited by examiner

*Primary Examiner*—Jeffrey Zweizig
(74) *Attorney, Agent, or Firm*—Posz Law Group, PLC

(57) ABSTRACT

A semiconductor device for driving a load includes a first semiconductor switching element interposed between a power supply terminal and a load, a second semiconductor switching element interposed between the load and a ground terminal, a high-side driver, a low-side driver, and a voltage regulator. The voltage regulator reduces a voltage applied to a control terminal of the second switching element, when a voltage of a load terminal of the second switching element is lower than a predetermined voltage. Then, a voltage applied between the load terminal and the ground terminal of the second switching element increases, and accordingly a voltage applied between the power supply terminal and the load terminal of the first switching element decreases.

2 Claims, 3 Drawing Sheets

SEMICONDUCTOR DEVICE FOR DRIVING A LOAD

CROSS REFERENCE TO RELATED APPLICATION

This application is based on Japanese Patent Application No. 2004-310865 filed on Oct. 26, 2004, the disclosures of which are incorporated herein by reference.

FIELD OF THE INVENTION

The present invention relates to a semiconductor device for driving a load, the device including a first semiconductor switching element controlled by a high-side driver and a second semiconductor switching element controlled by a low-side driver.

BACKGROUND OF THE INVENTION

A squib driver integrated circuit (IC) for driving an airbag squib is disclosed in a data sheet of a squib driver TPD2004F of Toshiba Semiconductor Company published on Sep. 11, 1998.

FIG. 3 is a simplified circuit diagram of the squib driver IC. A high-side circuit 1 includes an n-channel metal oxide semiconductor field effect transistor (MOSFET) 3 and a high-side driver 2, which is a charge-pump type. The high-side driver 2 controls a gate voltage of the MOSFET 3. A drain and a source of the MOSFET 3 are connected to a power supply terminal VBB and an output terminal SH, respectively. A low-side circuit 4 includes an n-channel MOSFET 6 and a low-side driver 5. The low-side driver 5 switches on and off the MOSFET 6. A drain and a source of the MOSFET 6 are connected to an output terminal SL and a ground terminal GND, respectively. A squib 7 (shown as a resistor in FIG. 3), which is a load, is interposed between the output terminals SH, SL.

The MOSFET 6 is kept fully turned on (saturated) during normal operation. The MOSFET 6 is turned off, when the MOSFET 3 cannot control the load current. Thus, the MOSFET 6 is capable of interrupting the current path to the squib 7.

Less voltage is applied between the drain and the source of the MOSFET 6 during normal operation, and consequently heat produced in the MOSFET 6 is negligible. In contrast, the voltage of the power supply terminal VBB is applied almost directly between the drain and the source of the MOSFET 3, and consequently heat produced in the MOSFET 3 is considerable. Even though there are the MOSFET 3 and the MOSFET 6 in the circuit, most of heat is produced in the MOSFET 3. Thermal margin of the MOSFET 3 is reduced accordingly. In other words, the risk of thermal breakdown of the MOSFET 3 is increased. Therefore, it is required to increase the size of the MOSFET 3 to prevent thermal breakdown of the MOSFET 3 and cost competitiveness is weakened.

SUMMARY OF THE INVENTION

In view of the above problem, it is an object of the present invention to provide a semiconductor device for driving a load, the device having a semiconductor switching element, adequate thermal margin of which can be provided without increasing size of the switching element.

The semiconductor device includes a first semiconductor switching element interposed between a power supply terminal and a load, a second semiconductor switching element interposed between the load and a ground terminal, a high-side driver, a low-side driver, and a voltage regulator. At least one of voltages of load terminals of the two semiconductor switching elements is regulated to a predetermined voltage, which is between voltages of the power supply terminal and the ground, so that a power supply voltage is dividedly applied to the two semiconductor switching elements.

Preferably, as long as the second switching element is kept turned on by the low-side driver (i.e., while the voltage applied by the low-side driver to a control terminal of the second switching element is relatively high so that the second switching element is saturated), a voltage of a load terminal of the second switching element decreases. Accordingly, a voltage applied between the power supply terminal and the load terminal of the first switching element increases. Then, when the voltage of the load terminal of the second switching element is lower than a predetermined voltage, the voltage regulator forcefully reduces the voltage applied to the control terminal of the second switching element. As a result, the voltage applied between the power supply terminal and the load terminal of the first switching element decreases at the same time when the voltage applied between the load terminal and the ground terminal of the second switching element increases.

The power supply voltage is divided between the first switching element and the second switching element. Heat produced in the first switching element can be reduced. Thermal margin of the first switching element increases accordingly. Therefore, there is no need to increase the size of the first switching element to prevent thermal breakdown of the first switching element. A cost competitiveness can be enhanced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

Figure 1:
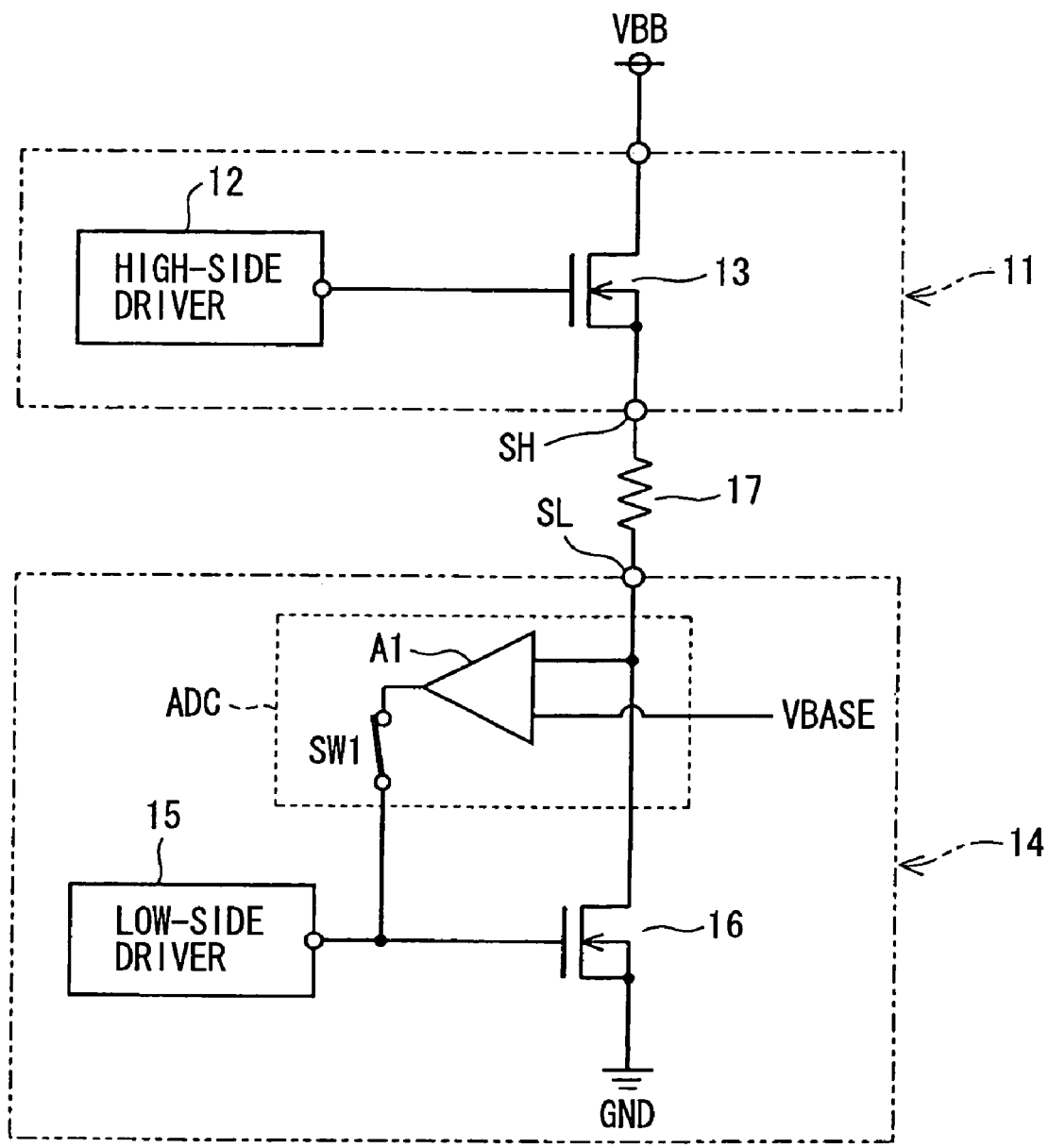
FIG. 1 is a circuit diagram of a semiconductor device according to an embodiment of the present invention.
Figure 2:
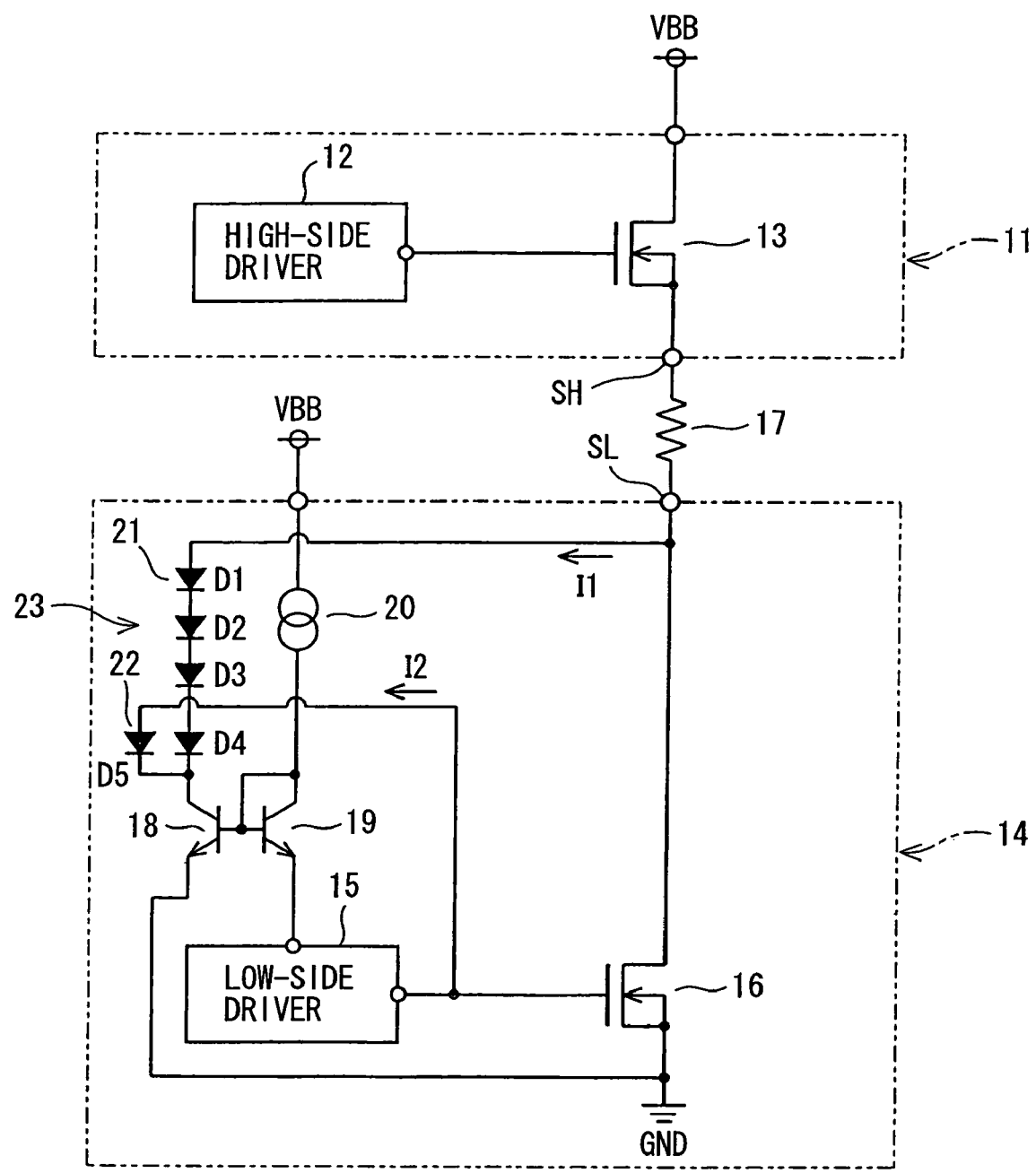
FIG. 2 is a detailed circuit diagram of the semiconductor device shown in FIG. 1.
Figure 3:
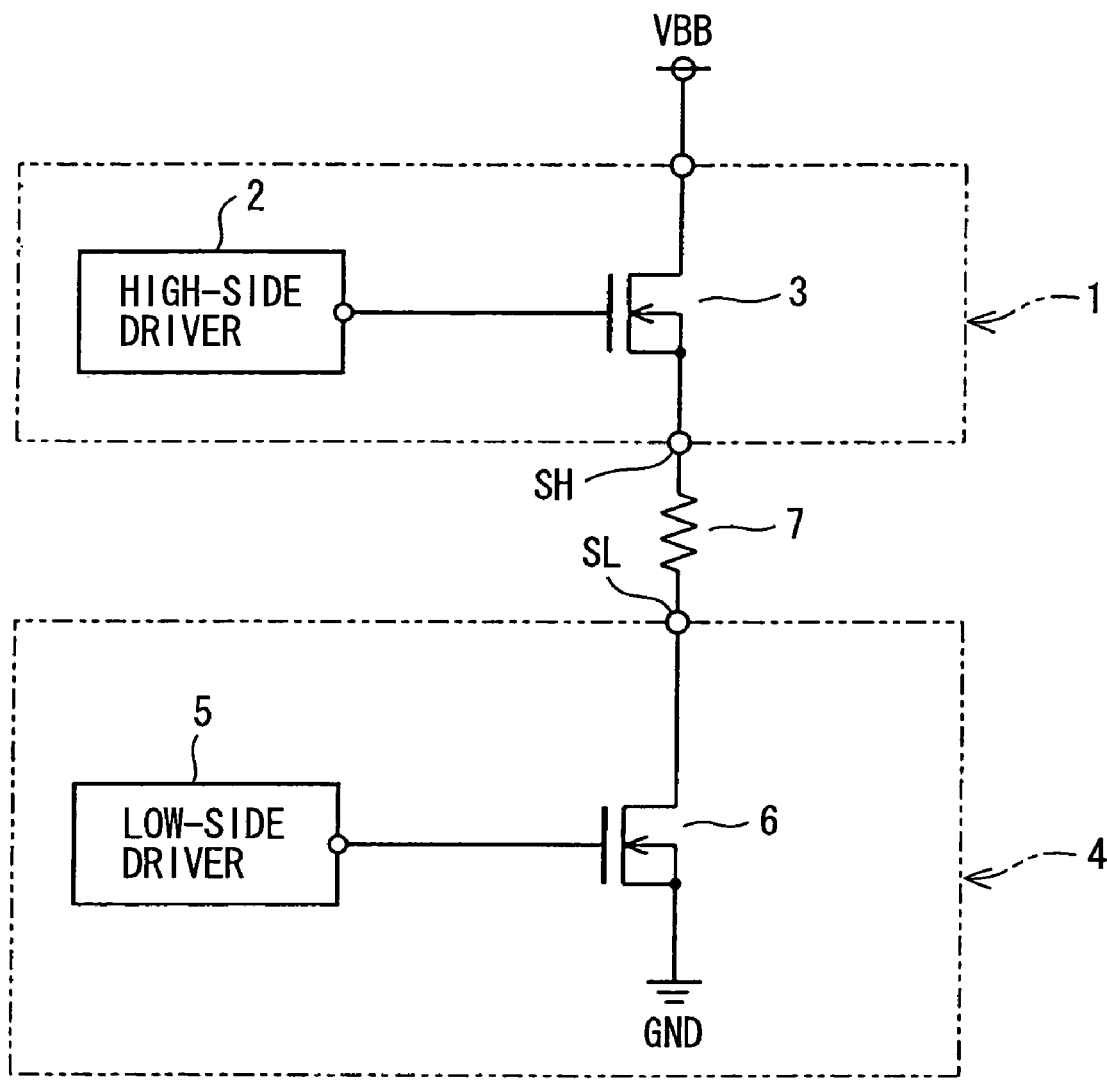
FIG. 3 is a circuit diagram of a conventional semiconductor device for driving a load.

Reference is made first to FIG. 1, which shows a semiconductor device used as a driver circuit in an airbag ECU. The driver circuit has a high-side circuit 11 and a low-side circuit 14.

The high side circuit 11 includes a high-side driver 12 fed from a charge-pump type voltage step-up circuit (not shown) and an n-channel LDMOS (Laterally Diffused MOSFET) 13 provided as the first semiconductor switching element. A voltage of a gate terminal (a control terminal) of the LDMOS 13 is controlled by the high-side driver 12. A drain terminal and a source terminal of the LDMOS 13 are connected to a power supply terminal VBB and an output terminal SH, respectively. The low-side circuit 14 includes a low-side driver 15 and an n-channel LDMOS 16 provided as the second semiconductor switching element. The low-side driver 15 controls a voltage of a gate terminal of the LDMOS 16 and switches on and off the LDMOS 16. A drain terminal and a source terminal of the LDMOS 16 are connected to an output terminal SL and a ground terminal GND, respectively. An airbag squib 17 (shown as a resistor) is interposed as an electric load between the output terminals SH and SL.

The LDMOS 16 is kept fully turned on (saturated) during normal operation. When the LDMOS 13 cannot control the load current, the LDMOS 16 is turned off. Thus, the LDMOS 16 is capable of interrupting the current path to the squib 17.

In this embodiment, the low side driver circuit 14 further includes an additional circuit ADC. The circuit ADC is composed of a voltage regulator A1 and a switch SW1. The voltage regulator A1 is shown as an operational amplifier.

A drain voltage of the LDMOS 16 and a predetermined voltage VBASE are applied to inputs of the voltage regulator A1.

The switch SW1 is kept turned off, as long as a voltage level of the power supply terminal VBB is relatively low so that heat produced in the LDMOS 13 can be negligible. When the switch SW1 is turned off, the circuit ADC has no effect on the low-side circuit 14. In contrast, the switch SW1 is turned on, when the voltage level of the power supply terminal VBB is relatively high so that heat produced in the LDMOS 13 may damage the LDMOS 13. The switch SW1 is optional.

While the switch SW1 is turned on, the voltage regulator A1 compares the drain voltage of the LDMOS 16 with the predetermined voltage VBASE. If the drain voltage of the LDMOS 16 is lower than the predetermined voltage VBASE, the voltage regulator A1 reduces a gate voltage of the LDMOS 16. The drain voltage of the LDMOS 16 increases as the gate voltage of the LDMOS 16 decreases. Then, when the drain voltage of the LDMOS 16 becomes higher than the predetermined voltage VBASE, the voltage regulator A1 increases the gate voltage of the LDMOS 16. The drain voltage of the LDMOS 16 decreases accordingly.

The voltage regulator A1 alternately increases and decreases the gate voltage of the LDMOS 16 so that the drain voltage of the LDMOS 16 can be equal to the predetermined voltage VBASE. Thus, the drain voltage of the LDMOS 16 can be held constant at a desired voltage by setting the predetermined voltage VBASE at the desired voltage. Therefore, the voltage applied between the drain and the source of the LDMOS 13 can be controlled using the predetermined voltage VBASE, and heat produced in the LDMOS 13 can be reduced.

As shown in FIG. 1, the circuit ADC includes two NPN bipolar transistors 18, 19 configured as a current mirror circuit, a constant current circuit 20, and five diodes D1-D5 configured as a voltage generator circuit. The constant current circuit 20 is fed with an electric power from the power supply terminal VBB and supplies a constant current to the low-side driver 15 through the transistor 19.

A first diode circuit 21 is composed of the four diodes D1-D4, which are connected in series. The first diode circuit 21 is connected in series between the output terminal SL of the low side driver 14 (i.e., drain of the LDMOS 16) and the collector of the transistor 18. Specifically, an anode side of the first diode circuit 21 is connected to the collector of the transistor 18 and a cathode side of the first diode circuit 21 is connected to the output terminal SL. A second diode circuit 21 is composed of the diode D5. An anode of the diode D5 is connected to the collector of the transistor 18 and a cathode of the diode D5 is connected to the gate of the LDMOS 16. An emitter of the transistor 18 is connected to the ground GND.

Consequently, the first diode circuit 21 is interposed in the forward direction between the drain of the LDMOS 16 (i.e., a terminal connected to the load 17) and the ground terminal GND. The second diode circuit is interposed in the forward direction between the gate of the LDMOS 16 and the ground terminal GND. The voltage regulator 23 is composed of the first and the second diode circuits 21, 22 and the transistor 18.

Operation of the circuit ADC will be now described with reference to FIG. 1. I1 is an electric current that flows between the collector and the emitter of the transistor 18 through the diodes D1-D4, when the first diode circuit 21 conducts. I2 is an electric current that flows between the collector and the emitter of the transistor 18 through the diode D5, when the second diode circuit 22 conducts. VF is a forward Voltage drop across each diode D1-D5. VCE is a voltage between the collector and the emitter of the transistor 18. The LDMOS 16 is full on, while a voltage level applied to the gate of the LDMOS 16 is higher than the sum of VCE and VF.

While the LDMOS 16 is fully turned on (i.e., while the gate voltage of the LDMOS 16 is relatively high so that the LDMOS 16 is saturated), the drain voltage of the LDMOS 16 is reduced to almost zero. Therefore, the first diode circuit 21 is maintained in non-conducting state and no current I1 flows. In contrast, the second diode circuit 22 conducts and the current I2 flows, because the gate voltage of the LDMOS 16 is higher than the sum of VCE and VF.

When the current I2 flows, the gate voltage of the LDMOS 16 decreases up to the sum of VCE and VF, and accordingly the drain voltage of the LDMOS 16 increases. Then, when the drain voltage of the LDMOS 16 becomes higher than or equal to the sum of the gate voltage of the LDMOS 16 and a voltage triple. VF, the first diode circuit conducts and the current I1 flows. Thus, the drain voltage of the LDMOS 16 is held constant at the sum of the gate voltage of the LDMOS 16 and the voltage triple VF in a series of operation, where the first diode circuit 21 and the second diode circuit 22 alternately conducts.

The voltage of the power supply terminal VBB is divided between the LDMOS 13 and the LDMOS 16, and consequently heat produced in the LDMOS 13 can be reduced. Thermal margin of the LDMOS 13 can be increased accordingly. Therefore, there is no need to increase the size of the LDMOS 13 to prevent thermal breakdown of the LDMOS 13. Cost competitiveness can be enhanced.

The embodiment described above may be modified in various ways. For example, a MOSFET, an insulated-gate bipolar transistor (IGBT), a bipolar transistor, or the like can be used as the semiconductor switching element instead of the LDMOS 13, 16.

Such changes and modifications are to be understood as being within the scope of the present invention as defined by the appended claims.

What is claimed is:

1. A semiconductor device for driving a load comprising:
   a first semiconductor switching element interposed between a power supply terminal and a load and having a first control terminal and a first load terminal connected to the load;
   a second semiconductor switching element interposed between the load and a ground terminal and having a second control terminal and a second load terminal connected to the load;

a high-side driver which controls the first semiconductor switching element by controlling a first voltage applied to the first control terminal;

a low-side driver which controls the second semiconductor switching element by controlling a second voltage applied to the second control terminal; and a voltage regulator which regulates a voltage at the second load terminal to a predetermined voltage, which is between voltages of the power supply terminal and the ground, by controlling the second control voltage in response to the voltage at the second load terminal, so that a supply voltage of the power supply terminal is dividedly applied to the first semiconductor switching element and the second semiconductor switching element, wherein the voltage regulator forcefully reduces the second control voltage applied from the low-side driver to the second control terminal in a state where the voltage of the second load terminal is lower than the predetermined voltage, the voltage regulator includes a first diode circuit interposed between the second load terminal and the ground terminal to allow a first electric current to flow in a forward direction from an anode side of the first diode circuit to a cathode side of the first diode circuit and a second diode circuit interposed between the second control terminal and the ground terminal to allow a second electric current to flow in a forward direction from an anode side of the second diode circuit to a cathode side of the second diode circuit, the first electric current flows through the first diode circuit only in a state where the voltage of the second load terminal is higher than a predetermined voltage, and the second electric current flows through the second diode circuit to reduce the voltage of the second control terminal in a state where no electric current flows through the first diode circuit.

2. The semiconductor device according to claim 1, wherein the first and the second semiconductor switching elements are metal oxide semiconductor field effect transistors.

* * * * *